(12) United States Patent
Yatabe

(10) Patent No.: US 6,636,071 B1
(45) Date of Patent: Oct. 21, 2003

(54) TRANSMITTING CIRCUIT, RECEIVING CIRCUIT, TRANSMITTING-RECEIVING CIRCUIT AND ELECTRO-OPTICAL APPARATUS

(75) Inventor: Satoshi Yatabe, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/657,278

(22) Filed: Sep. 7, 2000

(30) Foreign Application Priority Data

Sep. 7, 1999 (JP) .............................. 11-253505

(51) Int. Cl.$^7$ ......................................... H03K 19/0175
(52) U.S. Cl. .............................. 326/80; 326/83; 326/63
(58) Field of Search .............................. 326/80, 81, 82, 326/83, 63, 68

(56) References Cited

U.S. PATENT DOCUMENTS

| | | | | |
|---|---|---|---|---|
| 4,382,249 A | * | 5/1983 | Jacobsthal | 307/361 |
| 4,620,310 A | * | 10/1986 | Lvovsky et al. | 307/270 |
| 4,639,766 A | * | 1/1987 | Schine | 307/219.1 |
| 5,808,481 A | * | 9/1998 | Thompson | 326/83 |
| 5,841,308 A | * | 11/1998 | Nagata | 327/307 |

\* cited by examiner

*Primary Examiner*—Don Le

(57) ABSTRACT

A circuit for transmitting/receiving a logic signal through a capacitor is provided, which prevents signal delay and malfunction on the receiving circuit side. The power supply voltage of the buffer that transmits the logic signal in the transmitting circuit is enhanced to be larger than the power supply voltage of the buffer that inputs the logic signal in the receiving circuit. As a result, the amplitude of the logic signal at the input point is expanded from the clipping level according to the protection diodes, so that the signal delay, as well as the malfunction are prevented.

18 Claims, 18 Drawing Sheets

CONNECTION POINT

CONNECTION POINT

TRANSMITTING CIRCUIT, RECEIVING CIRCUIT, TRANSMITTING-RECEIVING CIRCUIT AND ELECTRO-OPTICAL APPARATUS

BACKGROUND OF THE INVENTION

1. Field of Invention

The present invention relates to, for example, a transmitting circuit that transmits a logic signal to a receiving circuit of which the power supply voltage is different, a receiving circuit, a transmitting-receiving circuit, and an electro-optical apparatus in which these circuits are used.

2. Description of Related Art

Generally, in an electro-optical apparatus, for example, in a liquid crystal panel, an element substrate on which a non-linear element, a pixel electrode and the likes are formed, and an opposite substrate on which an opposite electrode (or a common electrode) that is opposite to the pixel electrode is formed, are pasted together while maintaining a certain gap with the electrode surfaces thereof opposing each other. A liquid crystal as an electro-optical material is sandwiched between this gap. Herein, in the element substrate, when using a 3-terminal type element such as a TFT (Thin Film Transistor) and the like as a non-linear element, and in the element substrate and the opposite substrate, when using a 2-terminal type element such as a TFD (Thin Film Diode) and the like as a non-linear element, at the respective peripheral areas other than at the pasted areas, a driving circuit (driver IC) is installed by the COG (Chip On Glass) technique, thereby reducing the number of connecting points in the liquid crystal panel.

SUMMARY OF THE INVENTION

Since an external control circuit is generally constituted of a CMOS circuit, an amplitude of its logic signal is about 3 to 5 V. On the other hand, in order to drive the non-linear element and/or the liquid crystal, a relatively higher voltage of about 20 V is required. As such, because the operational voltage ranges of both circuits are different from each other, it is more convenient from the view point of design that the power supply voltage of the logic signal in the external control circuit and the power supply voltage of the driving circuit be separated each other in the arrangement.

However, with this arrangement, it is not possible to supply the logic signal of the external control circuit to the driving circuit directly. Therefore, conventionally, as shown in FIG. 18, a logic signal is output from a buffer 410 constituting an output stage of the external control circuit through a capacitor 500, and then is supplied to the buffer 610 constituting an input stage of the driving circuit indirectly. That is, in the arrangement as shown in FIG. 18, for the power supply voltage of the buffer 410 in the external control circuit, the voltage V1 and the ground potential GND are used, but for the power supply voltage of the buffer 610 in the driving circuit, voltage V2 and voltage V3 are used. Herein, V1−GND=V2−V3. Further, D1 and D2 represent the protection diodes.

Incidentally, from the external control circuit to a connection point of the liquid crystal panel, an FPC (Flexible Printed Circuit) substrate is used for wiring, and on the other hand, from the connection point of the liquid crystal panel to the driving circuit, a transparent conductor such as ITO (Indium Tin Oxide) deposited on the substrate is patterned for wiring. Herein, Rx represents the wiring resistance of the transparent conductor and Cx represents the stray capacitance of the transparent conductor. Furthermore, for generalizing the description, it is assumed that the external control circuit is to be the transmitting circuit 400 in a sense of transmitting the logic signal, and the driving circuit is to be the receiving circuit 600 in a sense of receiving the logic signal.

However, the wiring resistance Rx of the transparent conductor such as ITO is much larger than the resistance of a copper foil of the FPC substrate. Further, since the wiring pitch of the transparent conductor is extremely narrow, the stray capacitance Cx thereof can not be ignored. Accordingly, as a result, with these wiring resistance Rx and the stray capacitance Cx, the signal waveform at the input point B in the receiving circuit 600 (the input signal waveform of the buffer 610) becomes, as shown in FIG. 19, dull in comparison to the signal waveform at the output point A in the transmitting circuit 400 (the output signal waveform of the buffer 410), and the delay time ΔT of the output signal from the buffer 610 becomes longer than the signal at the output point A. Further, because a signal amplitude at the input point B becomes smaller than the voltage "V2–V3", the noise margin α of the peak value and the threshold value of the buffer 610 decreases, and thus there is a problem that in the worst case, a malfunction will also occur.

The present invention is made in light of at least the above described problem, and one object of the present invention is to provide a transmitting circuit for transmitting a logic signal that prevents a malfunction on the circuit side, even if the wiring resistance and the stray capacitance increase on a receiving circuit side (the other party of the logic signal), a receiving circuit, a transmitting-receiving circuit, and an electro-optical apparatus that uses these circuits.

An exemplary embodiment according to the present application is a transmitting circuit for transmitting a logic signal to a receiving circuit through a capacitor. The amplitude voltage of the logic signal to be transmitted is made larger than the power supply voltage to the logic element that receives the logic signal in the receiving circuit. As a result thereof, since the amplitude of the logic signal to be received in the receiving circuit is expanded, the delay time may be shortened and there may be room in the noise margin. Further, according to this arrangement, there is no need to modify the arrangement on the receiving circuit side.

The transmitting circuit of this exemplary embodiment preferably consists of a level shifter for expanding the amplitude voltage of the logic signal to be transmitted. With this arrangement, a relatively simpler arrangement is feasible, while separately requiring a different power supply voltage for simply operating the level shifter on the receiving circuit side.

The transmitting circuit of this exemplary embodiment may include a holding element for holding a predetermined voltage. The level shifter is preferably a logic element in which a voltage, to or from which the predetermined voltage being held in the holding element is added or subtracted, is set to be the power supply voltage. According to this arrangement, the predetermined voltage is set-up as a result thereof, and with the logic element which sets the predetermined voltage as the power supply thereof, an expansion of the amplitude of the logic signal to be transmitted is attempted. Further, as the predetermined voltage, the power supply voltage of the logic circuit placed at the front stage of the level shifter is appropriate. As a result, a single power supply voltage in the transmitting circuit will be sufficient.

On the other hand, to expand the amplitude of the logic signal to be transmitted other than with the level shifter, an arrangement including a holding element for holding a predetermined voltage is considered in which a voltage being held in the holding element is added to or subtracted from one of the levels of the logic signal to be transmitted. With such arrangement, it is possible to expand the amplitude of the logic signal in the receiving circuit by a single power supply voltage.

Another exemplary embodiment according to the present application is a receiving circuit for receiving a logic signal transmitted from a transmitting circuit through a capacitor. The power supply voltage to the logic element to which the received logic signal is input is made smaller than the amplitude voltage of the logic signal transmitted from the transmitting circuit. Accordingly, this arrangement is may be maintained without modifying the arrangement on the transmitting circuit side.

The receiving circuit of this exemplary embodiment preferably further includes a buffer for inputting a received logic signal, and a feedback circuit for feed-backing an output signal of the buffer to an input of the buffer. According to this arrangement, the change starting point of the received logic signal is fixed, so that malfunction can be more suppressed. Further, with an arrangement that further includes a buffer for buffering by adding a hysteresis characteristic to the received logic signal, the similar effect may result.

In addition, another exemplary embodiment according to the present application is a transmitting-receiving circuit, which includes a transmitting circuit and a receiving circuit, for receiving a logic signal transmitted from the transmitting circuit with the receiving circuit through a capacitor. The amplitude voltage of a logic signal to be sent out from the transmitting circuit is made larger than the power supply voltage to the logic element that receives the logic signal in the receiving circuit. According to such arrangement, although there are wiring resistance and stray capacitance on the receiving circuit side, the logic signal received in the receiving circuit will be not easily affected by a dull of the waveform and a decrease in the amplitude. As a result, signal delay is prevented and noise margin is secured, so that malfunction on the receiving circuit will be suppressed.

The arrangement of this exemplary embodiment preferably includes two sets of power supply voltages with approximately equal voltage differences that are alternately supplied for a predetermined period of time as the power supply voltage to the logic element into which the received logic signal is input. As a result, the withstanding pressure required for the logic element that receives the logic signal in the receiving circuit can be suppressed by being lowered.

Further, another exemplary embodiment according to the present application is an electro-optical apparatus which includes a pair of substrates, and an electro-optical material provided therebetween. A pixel is provided corresponding to each intersection of scanning lines and data lines. A transmitting circuit as discussed above is used as an input circuit in a scanning line driving circuit that drives the scanning lines. The scanning line driving circuit is installed on a substrate on which the scanning lines are formed, among the pair of substrates.

Similarly, another exemplary embodiment according to the present application is an electro-optical apparatus which includes a pair of substrates, and an electro-optical material provided therebetween. A pixel is provided corresponding to each intersection of scanning lines and data lines, where a plurality of scanning lines is formed on one of the substrates, and a plurality of data lines is formed the other substrate among the pair of substrates, or where a plurality of scanning lines and a plurality of data lines being formed on one of the substrates. A scanning line driving circuit is installed on a substrate on which the scanning lines are formed, among the pair of substrates, for driving the scanning lines. A control circuit is provided for supplying a logic signal as a control signal to the scanning line driving circuit. The scanning line driving circuit receives a logic signal supplied from the control circuit through a capacitor. The power supply voltage to the logic circuit that outputs a logic signal corresponding to the received logic signal is smaller than the amplitude voltage of the logic signal supplied from the control circuit.

DETAILED DESCRIPTION OF PREFERRED EMBODIMENTS

In the following, with reference to the drawings, the exemplary embodiments of the present invention will be described.

<First Exemplary Embodiment>

Figure 1:
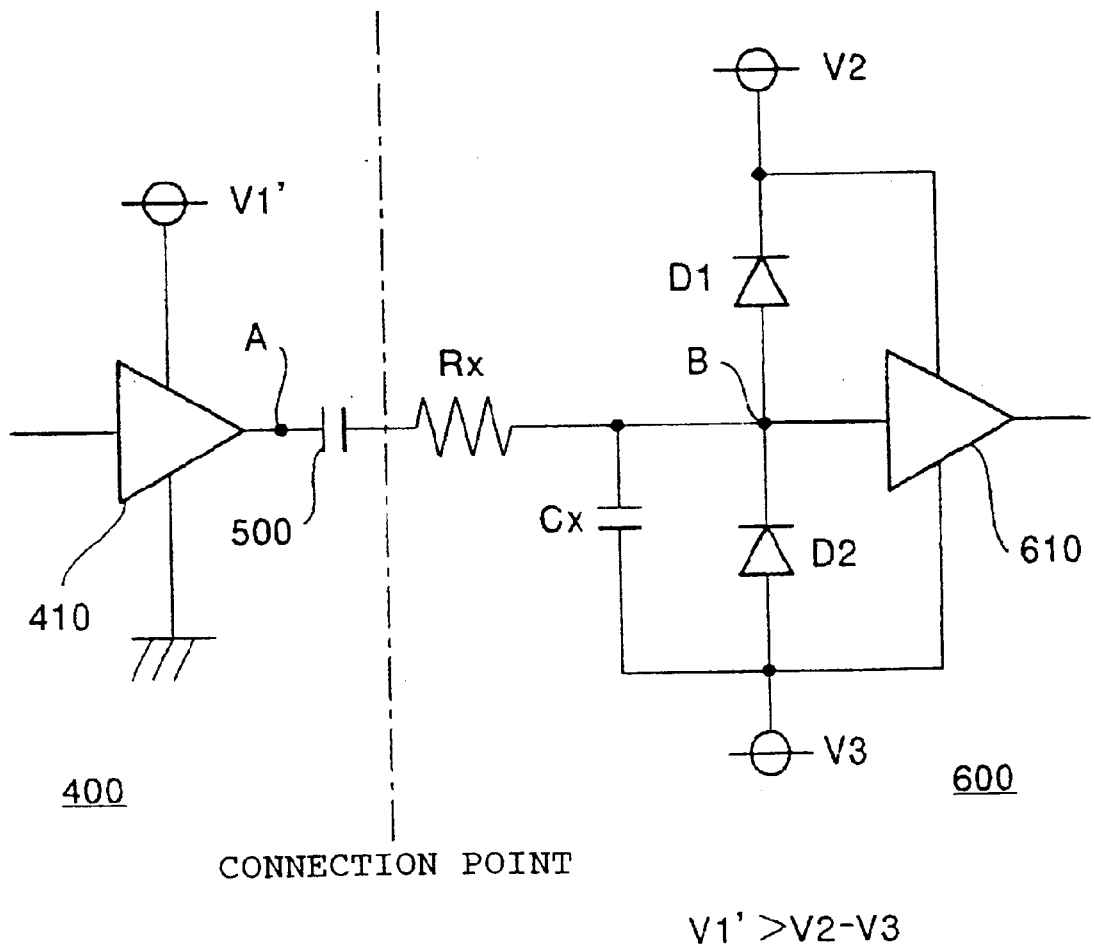
FIG. 1 is a block diagram showing an arrangement of the first exemplary embodiment of the present invention.
Figure 2:
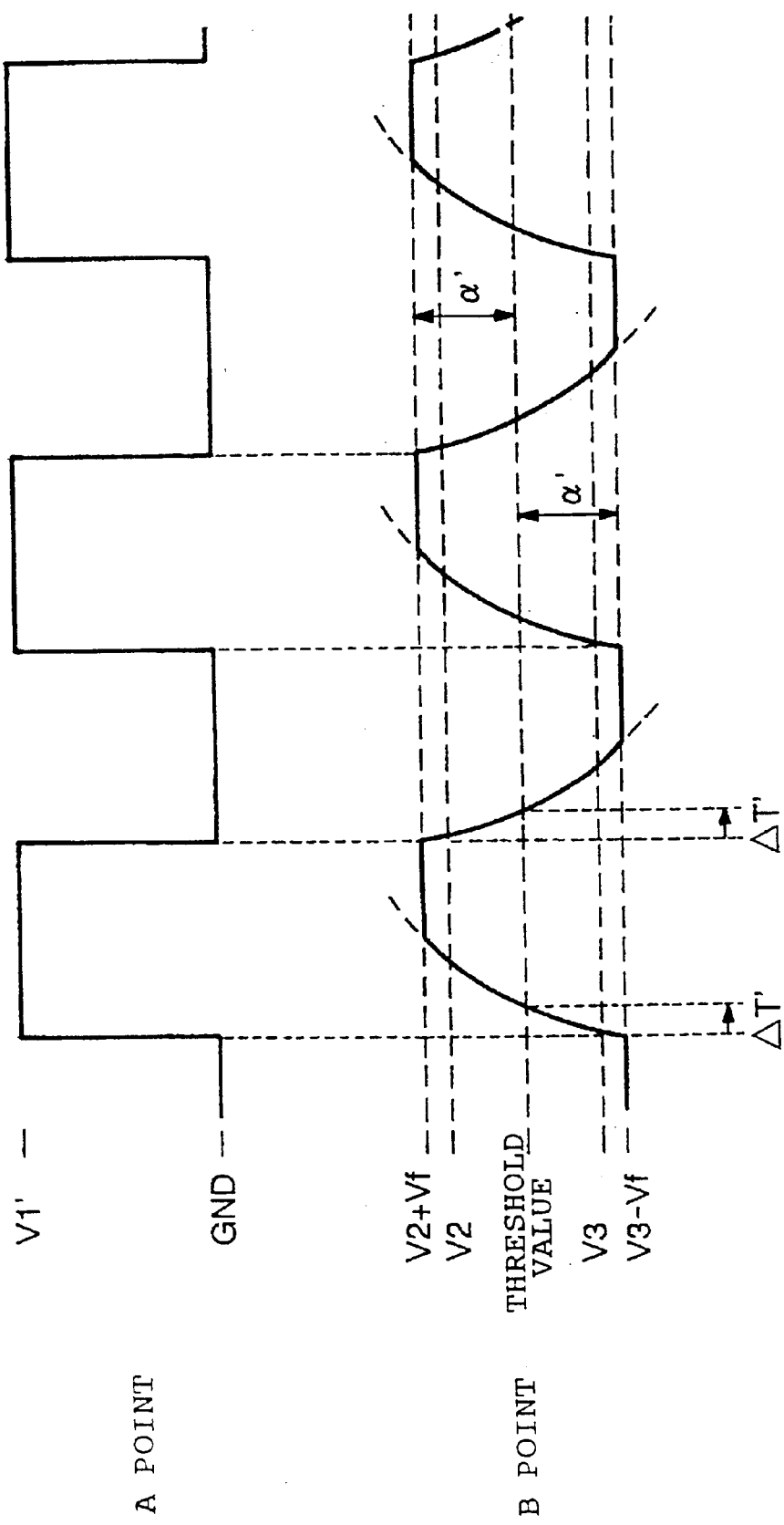
FIG. 2 is a voltage waveform diagram for illustrating an operation of the first exemplary embodiment.

A first exemplary embodiment of the present invention will be described as follows. FIG. 1 is a block diagram showing an arrangement thereof. As shown in FIG. 1, in this exemplary embodiment, in the transmitting circuit 400, the power supply voltage of the buffer 410 that transmits a logic signal has been enhanced from V1 to V1'. As a result, the amplitude of the logic signal at the output point A becomes "V1–GND" as shown in FIG. 2, so as to be larger than the power supply voltage "V2–V3" of the buffer 610 that inputs the logic signal in the receiving circuit 600. At that moment, assuming the forward voltage drop portions in the in the protection diodes D1 and D2 to be Vf, the amplitude of the logic signal at the input point B is expanded from "V2+Vf", that is the clipping level with the protection diodes D1 and D2, to "V3–Vf".

Accordingly, even if there are wiring resistance and stray capacitance and the like in the buffer 610 that receives the logic signal in the receiving circuit 600, the delay time of the output signal thereof becomes ΔT', and thus, is apparently shorter than the conventional delay time ΔT. With an expansion of the amplitude of the logic signal at the input point B, a noise margin between the peak value and the threshold value of the buffer 610 becomes α', and thus, a larger margin will result than the conventional noise margin α. As a consequence, signal delay is prevented and the noise margin is secured, so that malfunction of the receiving circuit 600 will be suppressed. Further, this arrangement may be maintained without modifying the configuration of the receiving circuit 600.

<Second Exemplary Embodiment>

Figure 3:
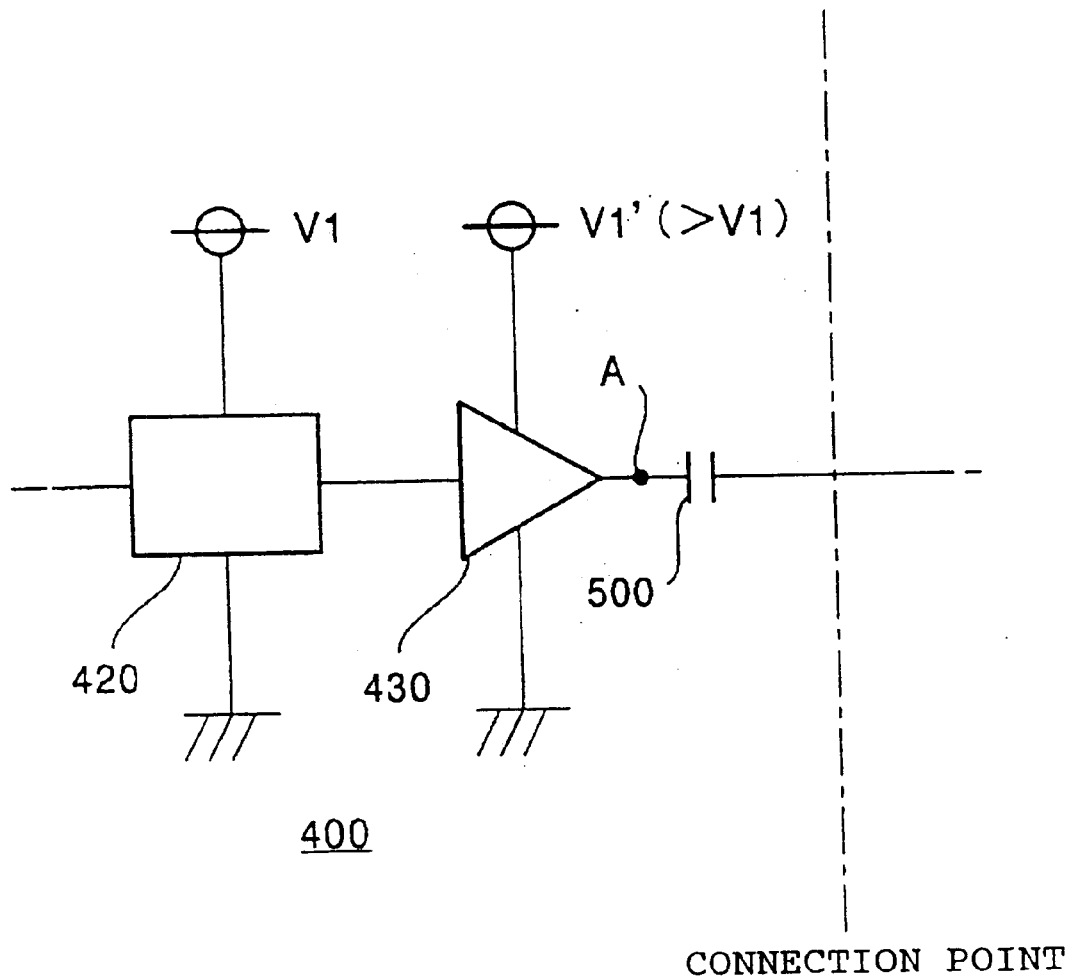
FIG. 3 is a block diagram showing an arrangement of the second exemplary embodiment of the present invention.

A second exemplary embodiment of the present invention will be described as follows. FIG. 3 is a block diagram showing an arrangement thereof. In FIG. 3, the processing circuit 420 is a circuit for logical processing in the transmitting circuit 400, and the previously mentioned "V1–GND" is set as the power supply voltage thereof. On the other hand, a buffer 430 is provided for expanding the amplitude of the logic signal from the processing circuit 420, with the higher "V1'–GND" voltage as the power supply voltage thereof. That is, the buffer 430 functions as a level shifter.

Figure 4:
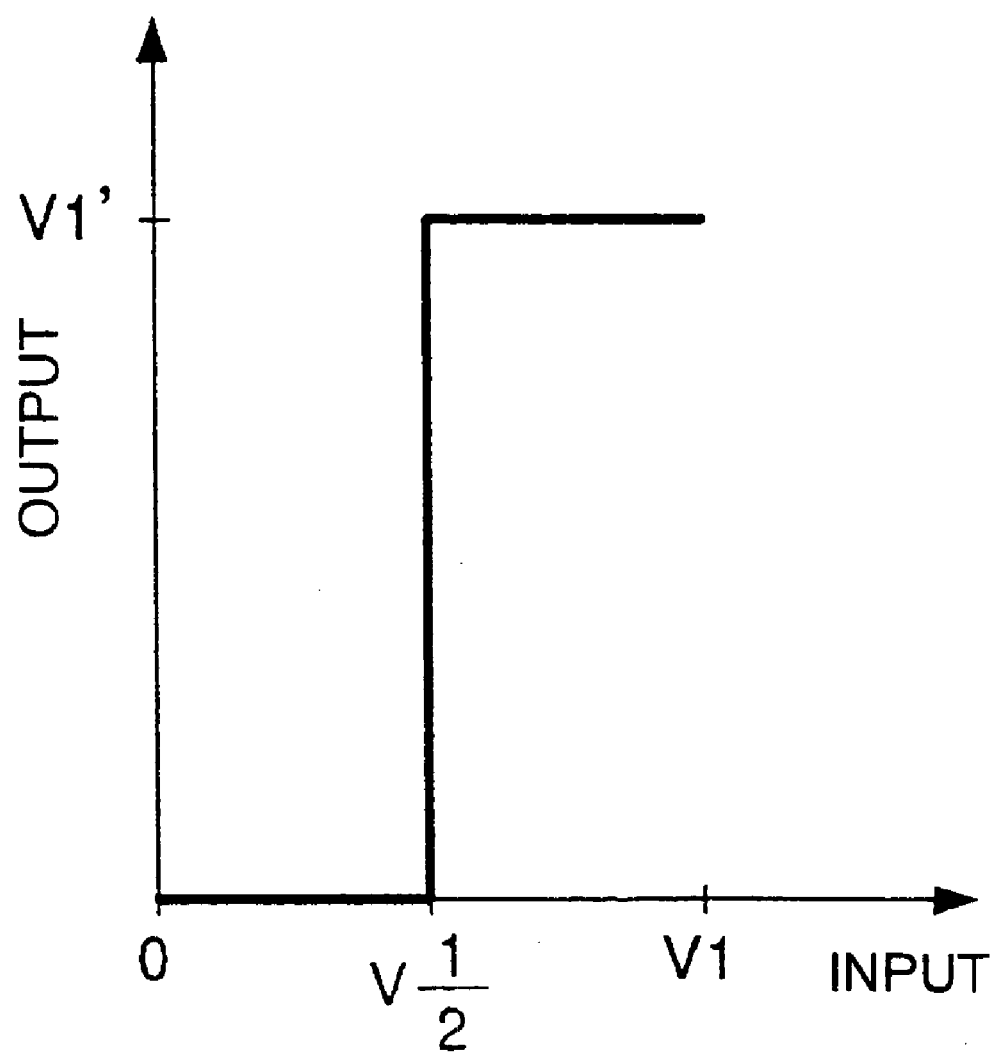
FIG. 4 is a diagram showing the input/output characteristics of the buffer in the second exemplary embodiment.
Figure 5:
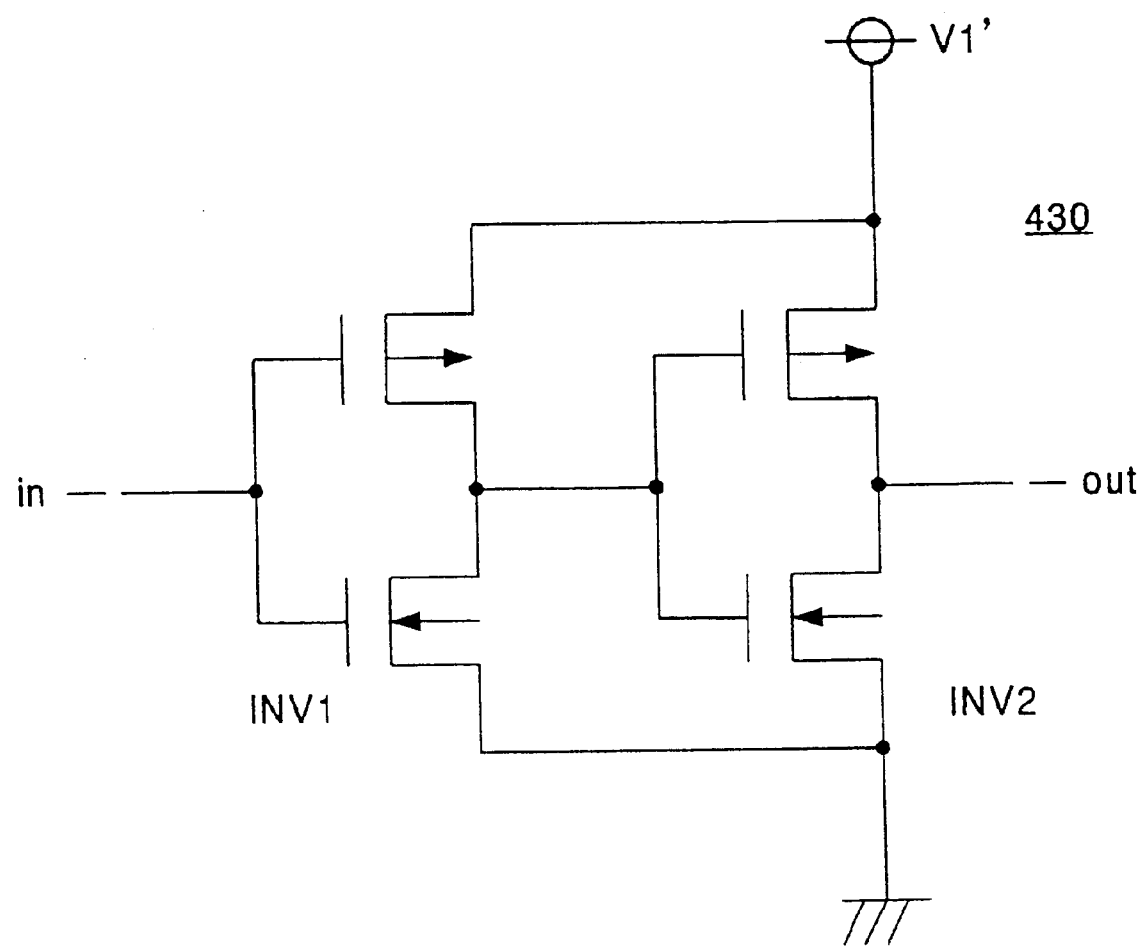
FIG. 5 is a diagram showing an equivalent circuit of the buffer of FIG. 4.

The input/output characteristics of the buffer 430 are as shown in FIG. 4, for example. That is, the buffer 430 is arranged to buffer the input logic signal with (V1)/2 being the threshold value. Also, the buffer 430 is, as shown in FIG. 5, for example, arranged such that the inverters INV1 and INV2 are connected in two-stages. Herein, the respective inverters INV1 and INV2 are arranged so that the P-channel type transistor and the N-channel type transistor are respectively sandwiched between the power supply voltage V1' and the ground potential GND. The input/output characteristics shown in FIG. 4 are set by adjusting the threshold values of the respective transistors that constitute the inverter INV1.

In the transmitting circuit 400, the amplitude of the logic signal is expanded in the buffer 430 at the last stage thereof. On the other hand, the logic processing is implemented with the conventional power supply voltage "V1–GND" in the processing circuit 420 at the prior stage thereof. As a result, the processing circuit 420 may be that having the conventional arrangement, and thus, the arrangement in which the buffer 430 is provided at the last stage thereof as the level shifter is maintained.

However, in an arrangement with the buffer 430 added thereto, although the conventional processing circuit 420 can be used, the power supply voltage V1' is required separately.

<Third Exemplary Embodiment>

Figure 6:
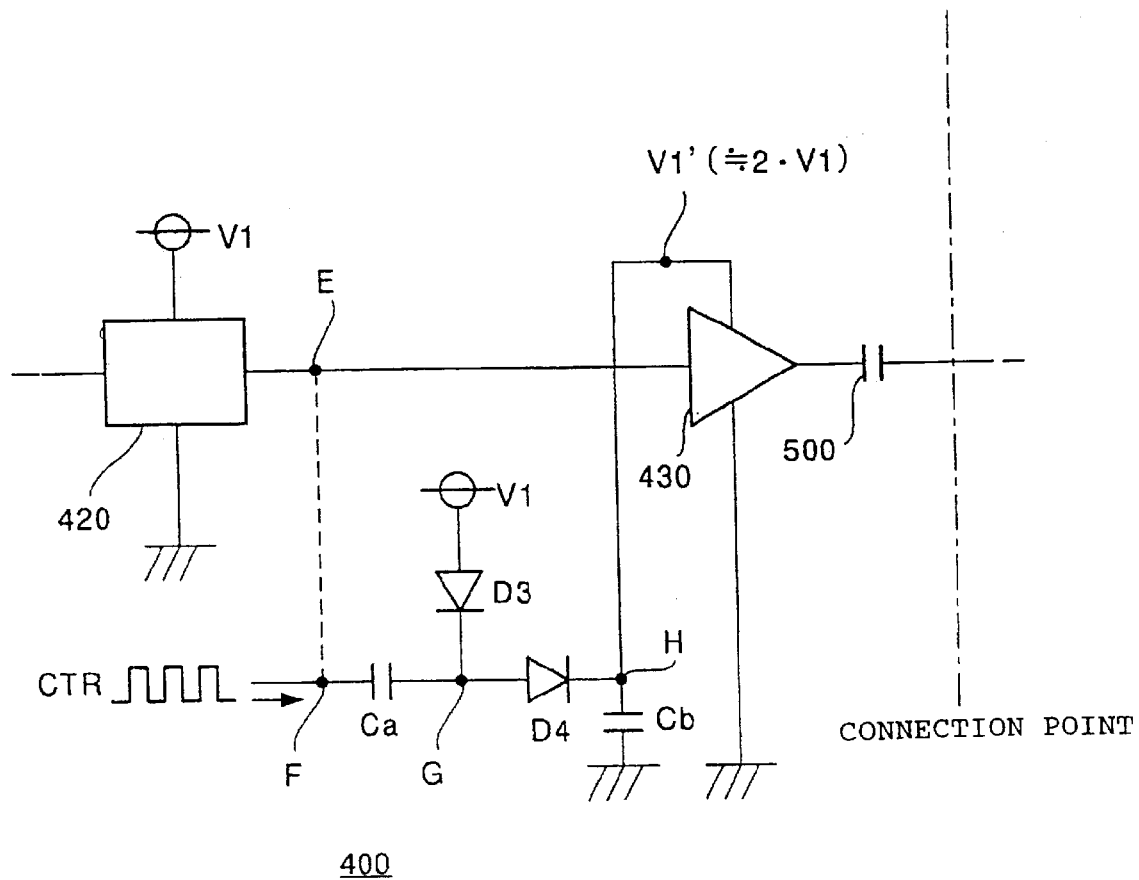
FIG. 6 is a block diagram showing an arrangement of the third exemplary embodiment of the present invention.

A third exemplary embodiment of the present invention will be described as follows. FIG. 6 is a block diagram showing an arrangement thereof. As shown in FIG. 6, the power supply voltage V1' of the buffer 430 is not produced separately, but rather is produced from the previously mentioned power supply voltage V1 in a following manner.

Initially, the control signal CTR, of which a duty ratio thereof is about 50%, the H-level thereof is the voltage VI, and the L-level thereof is the ground potential GND, is provided to point F. Herein, point F is connected to point G through the capacitor Ca. Further, this point G is connected to the supply line of the power supply voltage V1 through the diode D3. Point G is also connected to point H through the diode D4, and the voltage at this point H is supplied as the power supply voltage on the positive electrode side of the buffer 430. Further, the capacitor Cb for use in voltage holding is sandwiched between point H and the ground potential GND.

In such arrangement, when the control signal CTR is at the L-level, a forward current flows through the diode D3, so that the capacitor Ca performs charging, with point G being a positive electrode. As a result, at point G, the voltage "V1–Vf " is to be held. Herein, Vf is a portion of the forward voltage drop of the diode D3. Then, when the control signal CTR is at the H-level, the diode D3 is turned off, and the forward current is shut down. At this moment, the potential at point G becomes a value of which the holding voltage by the capacitor Ca is added to the H-level of the control signal CTR, and is to be held in the capacitor Cb through the diode D4. Then, even when the control signal CTR is at the L-level again, the holding voltage of the capacitor Cb is maintained by a block of the diode D4. Accordingly, the voltage at point H that is held by the capacitor Cb becomes 2·V1−2·Vf, and this voltage is to be used for the power supply voltage on the positive electrode side of the buffer 430. Herein, if the Schottoky diodes are used for the diodes D3 and D4, then the portion of the voltage drop Vf becomes smaller, so that the voltage V1' becomes approximately 2·V1.

Therefore, by arranging as described above, the amplitude of the logic signal to be transmitted is expanded with the buffer 430, and the power supply voltage V1' of the buffer 430 is produced by the previously mentioned power supply voltage V1, so the power supply voltage V1' is not produced separately, and thus contributing to the simplification of the arrangement.

Further, with the arrangement shown in FIG. 6, although the control signal CTR at point F is supplied separately, if the duty ratio of the logic signal that is output from the processing circuit 420 is about 50%, then the output point E of the processing circuit 420 and point F may be shortened. According to the arrangement as such, the logic signal from the processing circuit 420 may be used as the control signal CTR, so that it is possible to not produce the control signal CTR separately, and thus enabling the simplification of the arrangement.

In the arrangement shown in FIG. 6, the power supply voltage on the positive electrode side of the buffer 430 may be produced by increasing the voltage V1, but the power supply voltage on the negative electrode side may be produced by decreasing the ground potential GND. Moreover, in this arrangement, the capacitors Ca and Cb are used for holding the voltage, so that these capacitors Ca and Cb may be replaced with the elements having the equivalent functions, such as a secondary battery and the like.

<Fourth Exemplary Embodiment>

Figure 7:
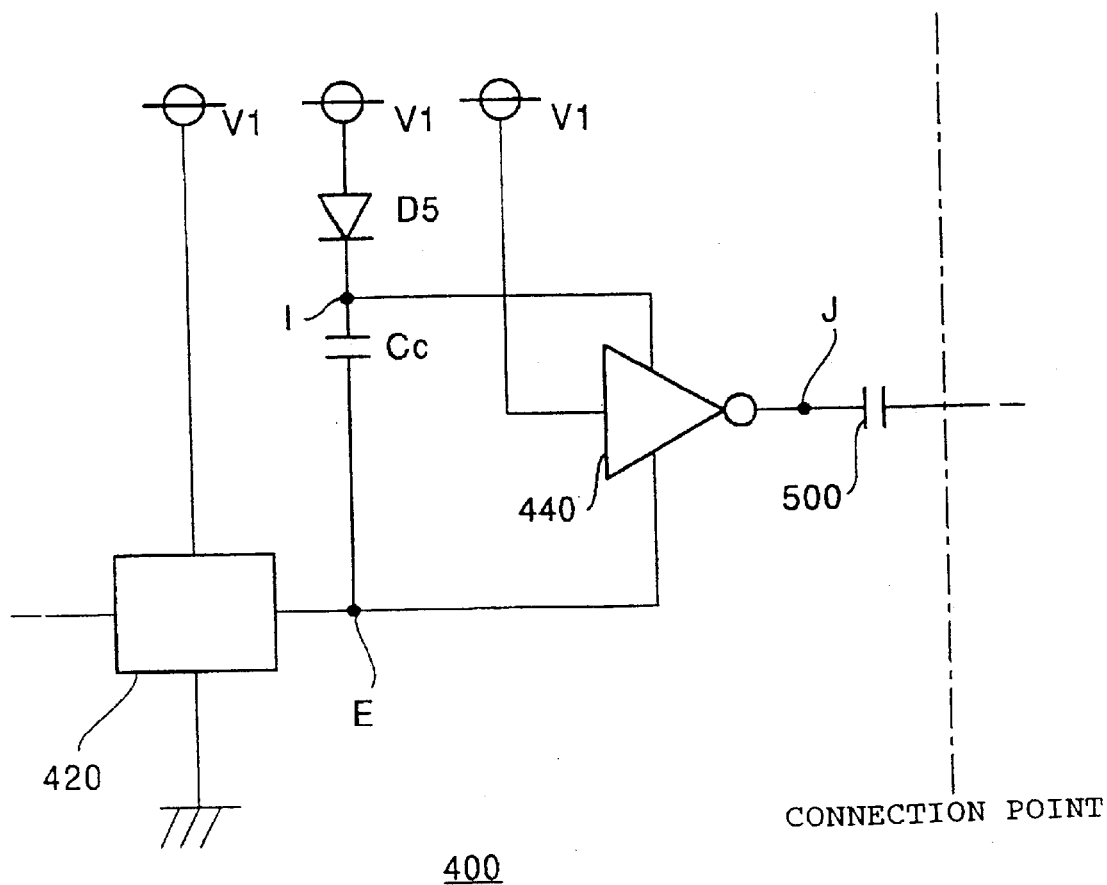
FIG. 7 is a block diagram showing an arrangement of the fourth exemplary embodiment of the present invention.

A fourth embodiment exemplary of the present invention will be described as follows. FIG. 7 is a block diagram showing an arrangement thereof. At first, the voltage at the output point E of the processing circuit 420 is supplied as the power supply voltage on the negative electrode side of the inverter 440. On the other hand, as the voltage on the positive electrode side, the voltage at point I is supplied. Herein, point I is a connection point from the supply line of the power supply voltage V1 through the diode D5, and also the capacitor Cc is sandwiched between point I and the output point E. Then, at an input of the inverter 440, the power supply voltage V1 is supplied.

In the arrangement as such, when the logic signal output from the processing circuit 420 is at the L-level, the forward current flows through the diode D5, so that the capacitor Cc performs charging with point I being a positive electrode. As a result, if the forward drop voltage of the diode D5 is to be Vf, then at point I, the voltage "V1−Vf" is to be held.

Figure 8:
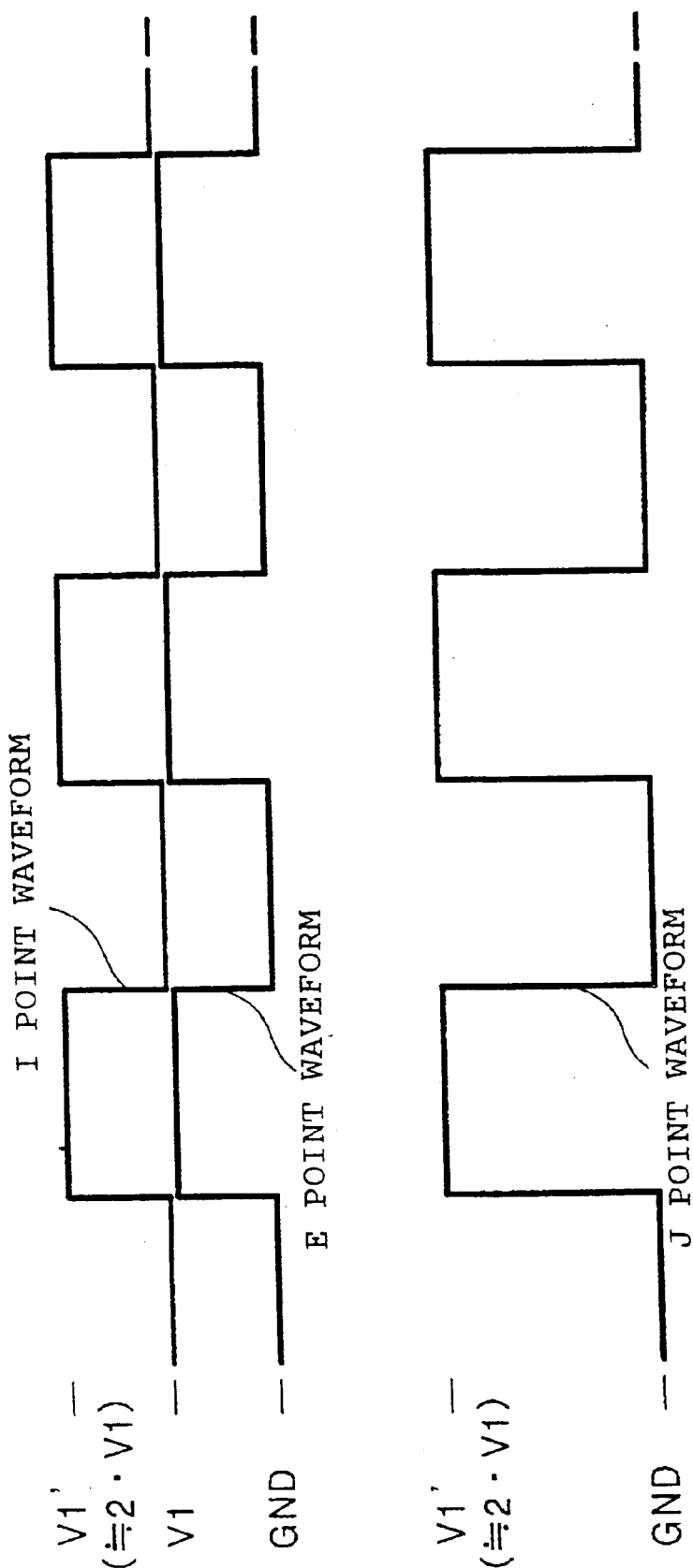
FIG. 8 is a voltage waveform diagram for illustrating an operation of the fourth exemplary embodiment.

Accordingly, the voltage waveform at point I is, as shown in FIG. 8, to be the one of which the voltage waveform at the output point E is always raised by the voltage "V1−Vf". Further, if a Schottky diode is used for the diode D5, then the drop voltage Vf becomes smaller, so that the raised portion becomes approximately V1.

Herein, in the inverter 440, when the power supply voltage on the positive electrode side is V1' (approximately 2·V1) and the power supply voltage on the negative side is V1, the voltage V1 of the input signal changes to the L-level logically, so that the output voltage of the inverter 440, that is, the voltage at point J becomes V1'. On the other hand, when the power supply voltage on the positive electrode side is V1 and the power supply voltage on the negative side is the ground potential GND, the voltage V1 of the input signal changes to the H-level logically, so that the output voltage of the inverter 440 becomes the ground potential GND.

That is, the present embodiment is arranged such that the logic signal output from the processing circuit 420 is output as the ground potential GND for the potential at the L-level. On the other hand, for the potential at the H-level, the logic signal is output as "V1−Vf" added to the original voltage V1. Accordingly, also with such arrangement, the amplitude of the logic signal to be transmitted is expanded by the inverter 440, and the power supply voltage V1 of the inverter 440 is produced by the previously mentioned power supply voltage V1, so that it is unnecessary to produce a power supply voltage V1' separately. Further, comparing to the arrangement shown in FIG. 6, one diode and one capacitor are sufficient, respectively, and only one stage of the inverter for the last stage of the transmitting circuit 400 is needed, contributing to the simplification of the arrangement.

Further, in the arrangement shown in FIG. 7, the H-level of the logic signal that is output from the processing circuit 420 is expanded, but, in the contrast thereto, the L-level is decreased. Moreover, in this arrangement, the capacitor Cc is used for holding the voltage, so that this capacitor Cc may be replaced with the element having an equivalent function, such as the secondary battery and the like. In addition, the inverter 440 may be integrated with the processing circuit 420, or may be separated therefrom.

<Fifth Exemplary Embodiment>

The first to fourth exemplary embodiments as described above are provided for at least expanding the amplitude of the logic amplitude in the transmitting circuit 400. However, in various exemplary embodiments according to the present application, it would be sufficient that the amplitude voltage of the logic signal to be transmitted becomes relatively larger than the power supply voltage to the logic element that receives the logic signal in the receiving circuit. Thus, the fifth exemplary embodiment of the present invention is arranged in the arrangement shown in FIG. 1. The power supply voltage of the buffer 410 in the transmitting circuit 400 in this exemplary embodiment is set to be "V1−GND" as previously mentioned, and the power supply voltage of the buffer 610 in the receiving circuit 600 is set to be less than "V2−V3".

Also with the arrangement as such, similar to the first exemplary embodiment, the signal delay is prevented as well as the noise margin is secured, so that the malfunction of the receiving circuit may be suppressed. Further, this arrangement is maintained without adding a modification to the arrangement of the transmitting circuit.

<Sixth Exemplary Embodiment>

Figure 9A:
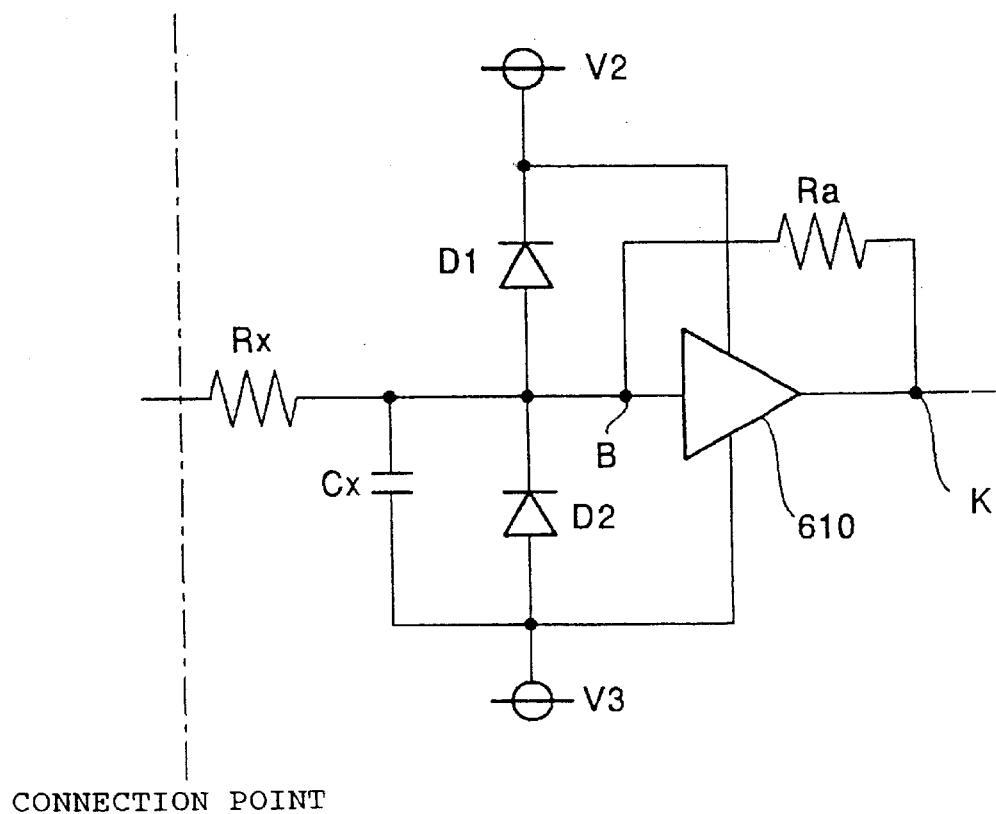
FIG. 9(a) is a block diagram showing an arrangement of the sixth exemplary embodiment of the present invention.

A sixth exemplary embodiment of the present invention will be described as follows. FIG. 9(a) is a block diagram showing an arrangement thereof. In the arrangement shown in FIG. 9(a), a resistor Ra is sandwiched between the output point K of the buffer 610 that inputs the logic signal transmitted from the transmitting circuit and the input point B, and the output signal from the buffer 610 is fed back to an input terminal thereof through the resistor Ra.

Figure 10:
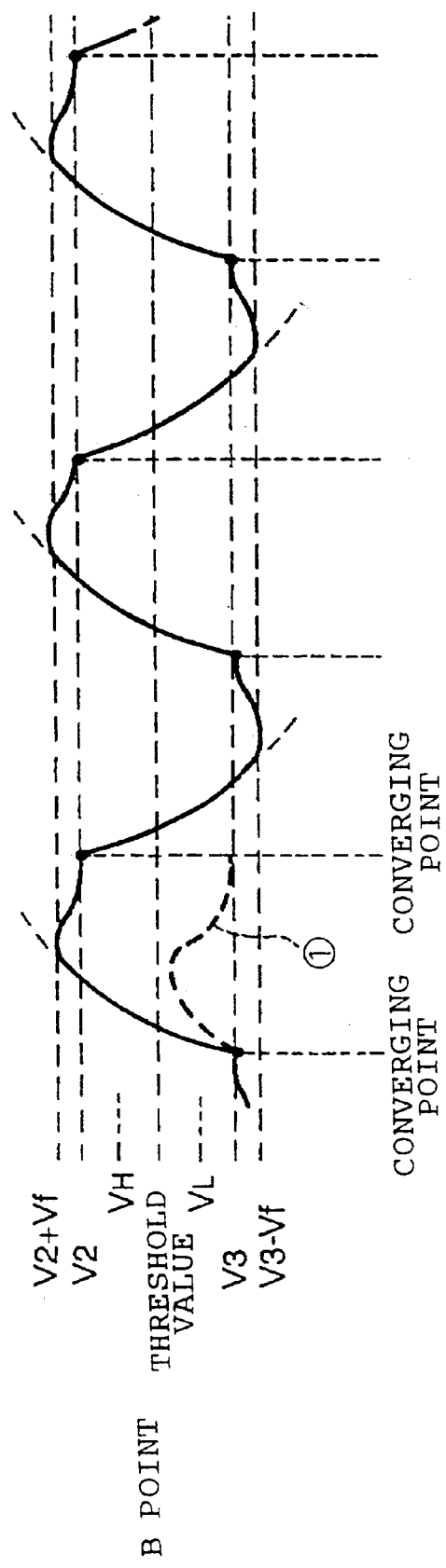
FIG. 10 is a voltage waveform diagram for illustrating an operation of the sixth exemplary embodiment.

With the arrangement as such, the signal waveform of the logic signal at the input point B is as shown in FIG. 10. That is, it is similar to the first exemplary embodiment regarding the point in which the amplitude of the logic signal is expanded from "V2+Vf" that is at the clipping level to "V3−Vf", but the output voltage of the buffer 610 is fed back to the input point B, so that the converging voltage becomes voltage V2 if it is at the H-level, and becomes V3 if it is at the L-level. Accordingly, a starting point of the voltage change becomes the power supply voltage V2 or V3, and thus approaches closer to the threshold value of the buffer 610 than "V2+Vf" or "V3−Vf" in the first exemplary embodiment. As a result, upon securing the noise margin, the signal delay is to be further suppressed.

Figure 9B:
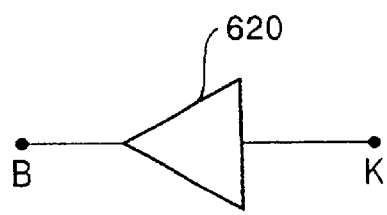
FIG. 9(b) is a partially replacement diagram of FIG. 9(a).

Further, at the output point K and the input point B, instead of the resistor Ra, as shown in FIG. 9(b), the similar effect may be obtained in the arrangement having a buffer 620 with a smaller drive capability.

<Seventh Exemplary Embodiment>

Incidentally, it may be rather difficult to set the resistor Ra to an appropriate resistance value in the sixth exemplary embodiment. That is, when the resistance value of the resistor Ra is larger, the time until when the voltage at the input point B converges to V2 or V3 becomes longer, so that the effect of preventing the signal delay may fade away. On the other hand, if the resistance value is smaller, for example, when transiting from the L-level to the H-level, the voltage at the input point B converges to the voltage V2 before exceeding the threshold value, shown as ① in FIG. 10, so that malfunction may occur.

Figure 11A:
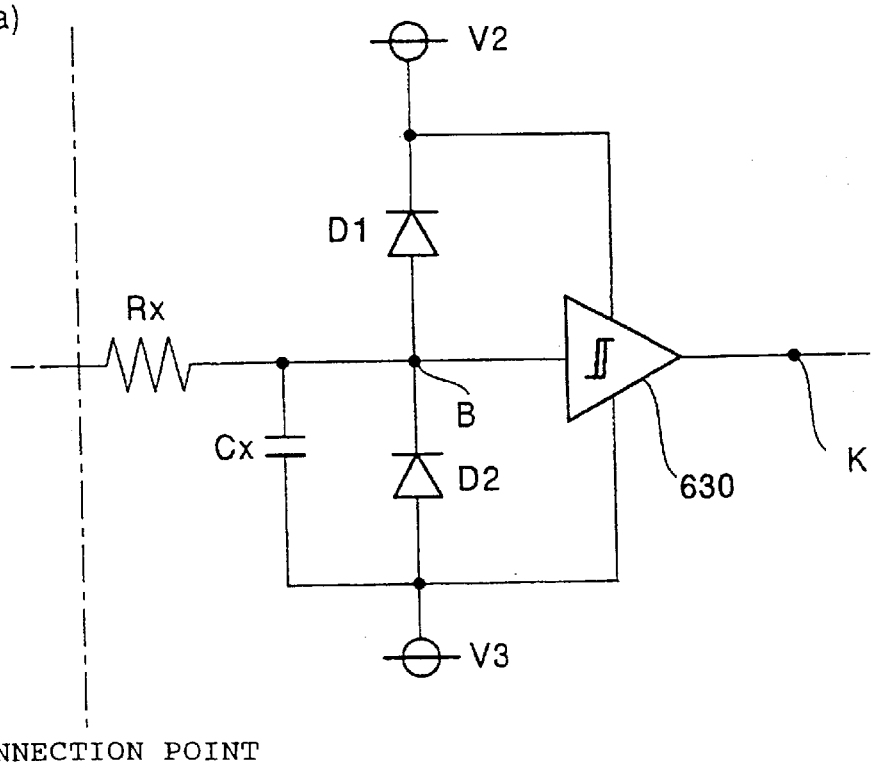
FIG. 11(a) is a block diagram showing an arrangement of the seventh exemplary embodiment of the present invention.
Figure 11B:
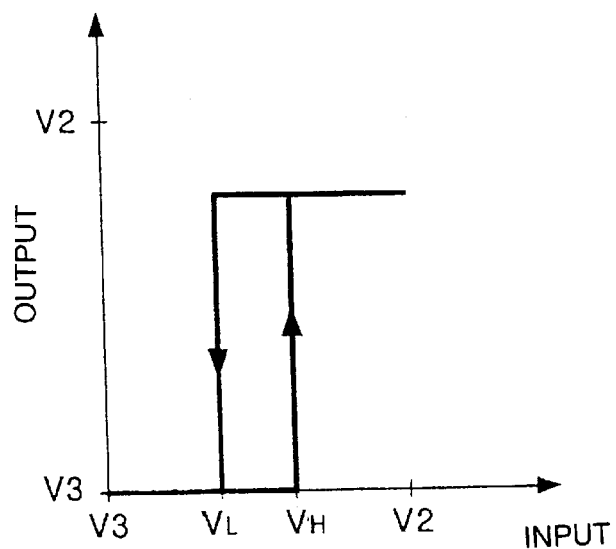
FIG. 11(b) is a diagram showing the input/output characteristics of the hysteresis buffer in the seventh exemplary embodiment.

Thus, the seventh exemplary embodiment intends to at least solve this problem. FIG. 11(a) is a block diagram showing an arrangement thereof. In the arrangement shown in FIG. 11(a), the resistor Ra in the sixth exemplary embodiment as described above is omitted, and the buffer 610 is replaced with the hysteresis buffer 630. Herein, the input/output characteristics of the hysteresis buffer 630 is to be as shown in FIG. 11(b).

With the arrangement as such, as the voltage at the input point B passes $V_H$ or $V_L$, and then the voltage at the output terminal K becomes V2 or V3, it may be maintained without being affected by noise, so long as it is within the hysteresis voltage, even if noise is added at the input point B.

<Eighth Exemplary Embodiment>

Figure 12:
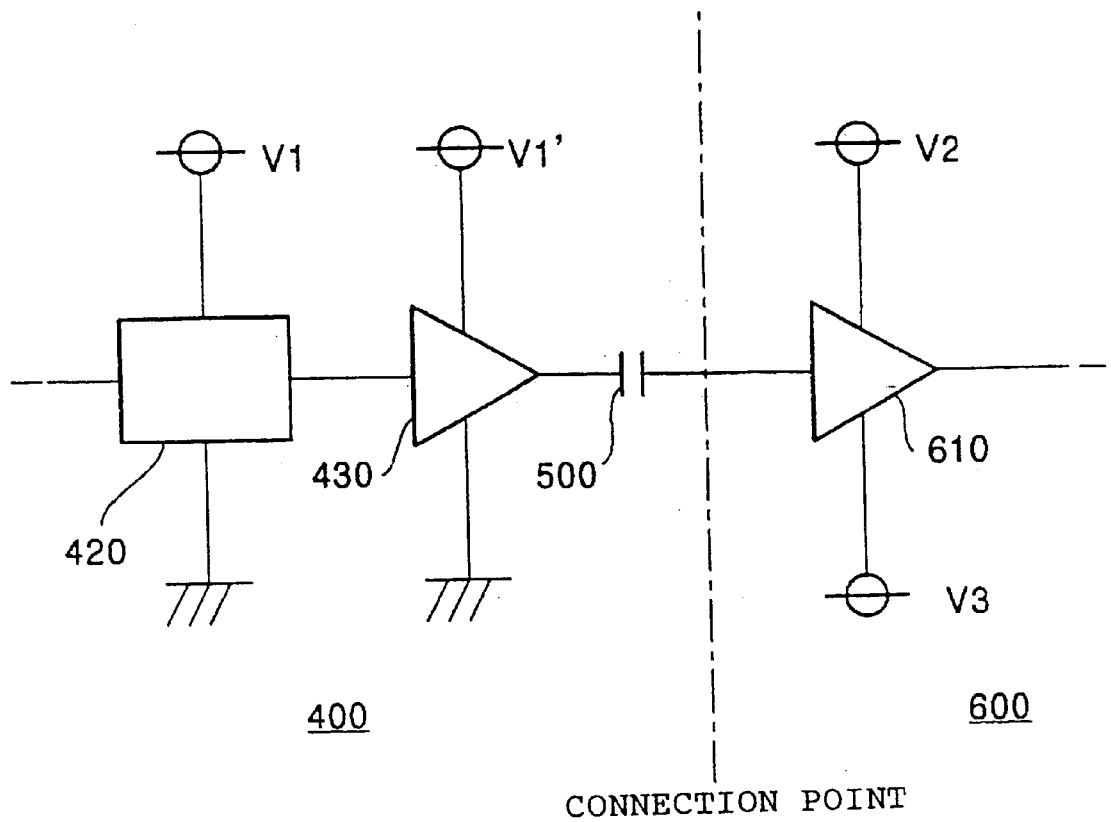
FIG. 12 is a block diagram showing an arrangement of the eighth exemplary embodiment of the present invention.
Figure 13:
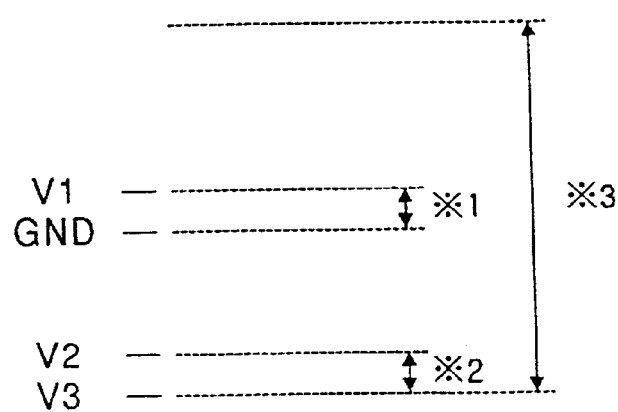
FIG. 13 is a diagram showing the voltage relations in the eighth exemplary embodiment.

An eighth exemplary embodiment of the present invention will be described as follows. FIG. 12 is a block diagram showing an arrangement thereof. This exemplary embodiment is arranged such that the amplitude of the logic signal that is processed in the processing circuit 420 of which "V1–GND" is set to be the power supply voltage thereof in the transmitting circuit 400, is expanded by a buffer 430 of which "V1'–GND" is set to be the power supply voltage thereof, and then is transmitted through the capacitor 500. On the other hand, the logic signal is received by the buffer 610 of which "V2–V3" is set to be the power supply voltage in the receiving circuit 600. Herein, even if the potential relations of V1 and GND of the receiving circuit 400 and V2 and V3 of the transmitting circuit 600 are different as shown in FIG. 13, as similar to the first and fifth exemplary embodiments, the signal delay is to be prevented, and the noise margin is to be secured, so that the malfunction on the receiving circuit side is to be suppressed.

Figure 14:
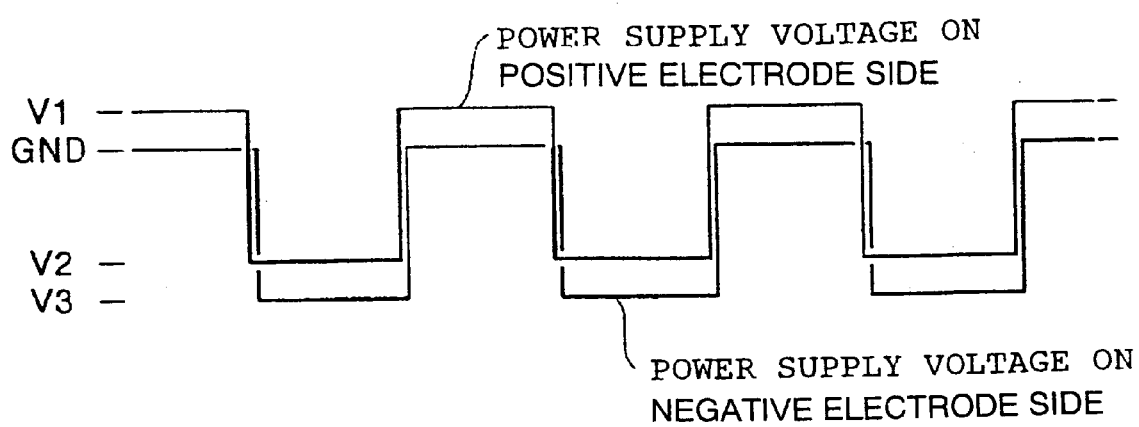
FIG. 14 is a voltage waveform diagram for illustrating an application operation in the eighth exemplary embodiment.

In the arrangement as such, according to a post stage circuit (not shown herein) of the buffer 610, as the power supply voltage of the buffer 610, for example as shown in FIG. 14, in some cases, V2 and V3 may be supplied, and in other cases, V1 and GND may be supplied. For example, the power supply of the buffer 610 may be arranged to supply "V2–V3" when the logic signal is at the H-level, and "V1–GND" when it is at the L-level, respectively. With this arrangement, the H-level of the logic signal that is output from the buffer 610 becomes V1, and the L-level becomes V3, so that even when the amplitude required in the post circuit of the buffer 610 is to be as shown in *3, the withstand pressure of the buffer 610 may be settled with "V1–GND" of *1 or "V2–V3" of *2.

<Ninth Exemplary Embodiment>

Figure 15:
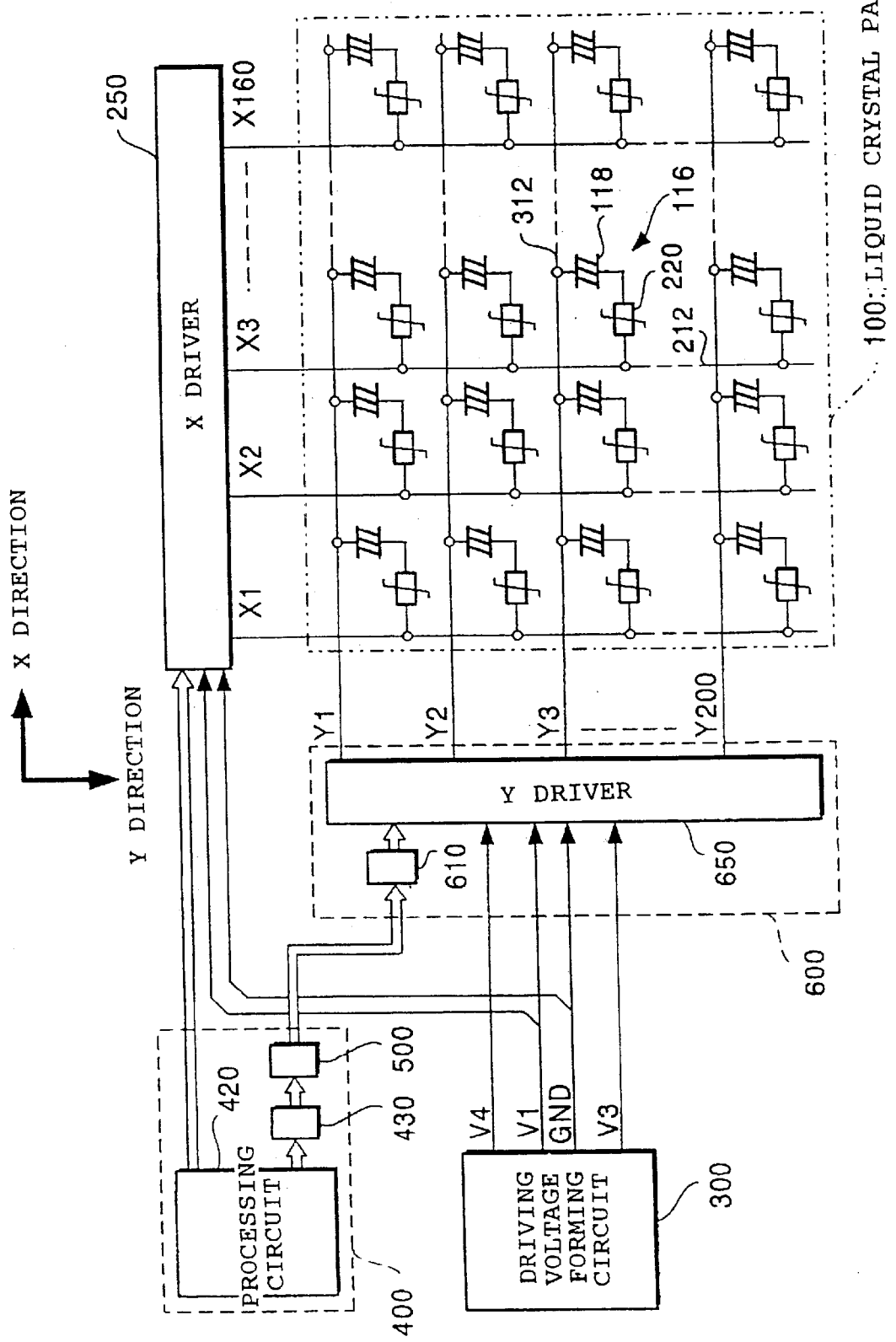
FIG. 15 is a block diagram showing an arrangement of the liquid crystal display device to which the eighth exemplary embodiment is applied.

A ninth exemplary embodiment of the present invention it will be described as follows. FIG. 15 is a block diagram showing an electrical arrangement of a liquid crystal display device as one example of the electro-optical apparatus. As shown in FIG. 15, in the liquid crystal panel 100, 160 lines of the data lines 212 are formed in a column (Y) direction, 200 lines of the scanning lines 312 are formed in a row (X) direction, and the pixels 116 are formed at the respective intersections of these data lines 212 and scanning lines 312. Then, each pixel 116 is arranged in which a liquid crystal display element (liquid crystal layer) 118 and a TFD (Thin Film Diode) 220 are connected in series.

Figure 16:
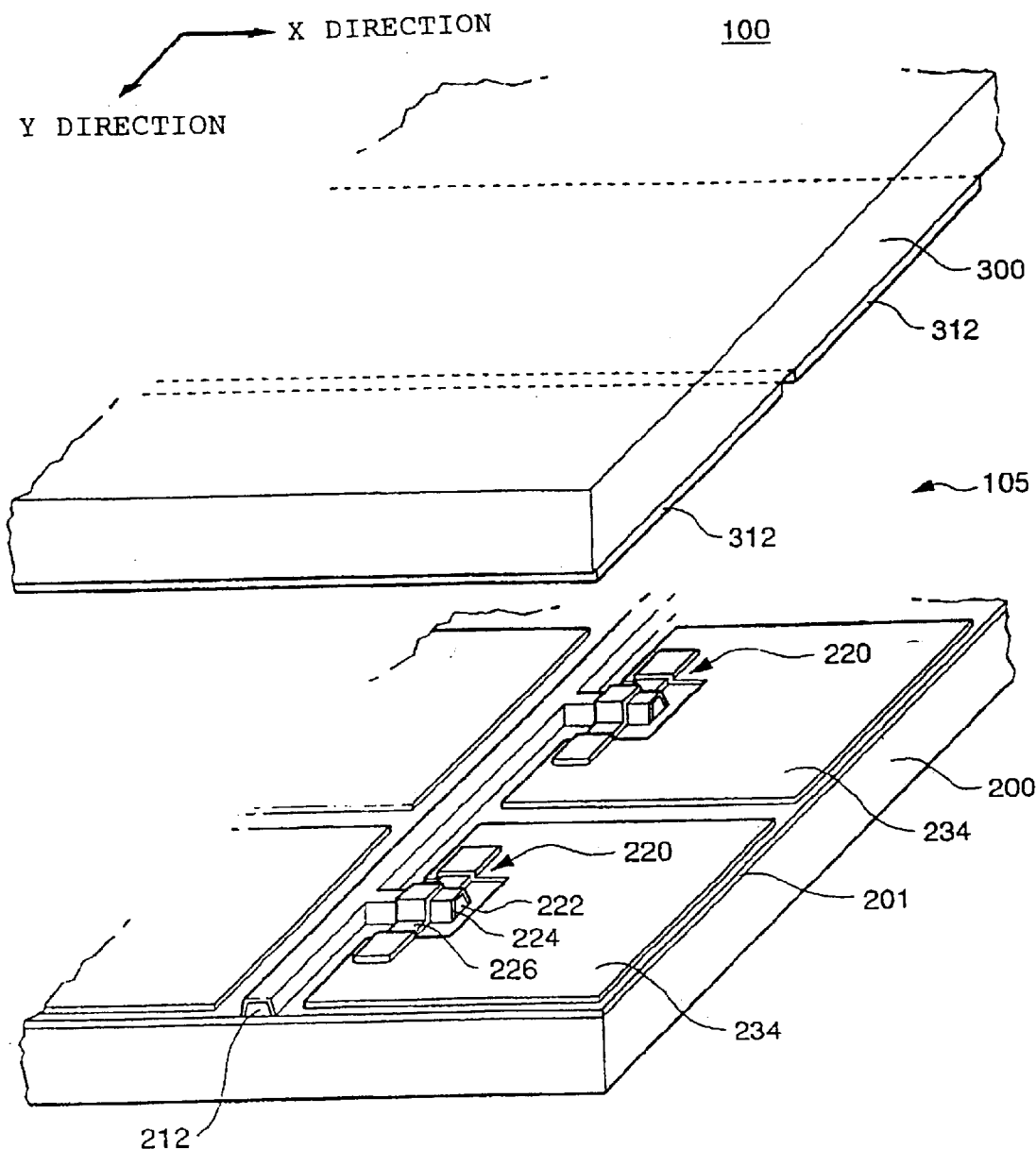
FIG. 16 is a partial cutaway perspective view showing schematically the main parts of the liquid crystal device of FIG. 15.

A detailed arrangement of the liquid crystal panel 100 will be described as follows. FIG. 16 is a partial cutaway perspective view that schematically shows the arrangement thereof. As shown in FIG. 16, the liquid crystal panel 100 may consist of an element substrate 200, and an opposite substrate 300 that is oppositely placed thereto. Among the substrates, on the opposing surface of the element substrate 200, a plurality of pixel electrodes 234 are arranged in a matrix. Herein, the pixel electrodes 234 that are arranged in the same column are connected to one line of the data lines 212, which extends as a strip in a column direction, through the TFD 220, respectively.

The TFD 220 is, as seen from the substrate side, constituted of a first metal film 222, an oxide film 224 in which the first metal film 222 is anode-oxidized, and a second metal film 226, and employs a sandwich structure of the metal/insulator/metal. As a result, the TFD 220 has the diode switching characteristics of the positive/negative dual directions.

On the other hand, on the facing surface of the opposite substrate 300, the scanning lines 312 are extended in a row direction that crosses with the data lines 212 at right angles, and are arranged as opposite electrodes to the pixel electrodes 234.

The element substrate 200 and opposite substrate 300 maintain a constant gap (space) with the sealing agent that is painted along the peripheries of the substrates, and with the spacers that are sprayed properly. In this closed space, for example, the liquid crystal 105 of the TN (Twisted Nematic) type is sealed, and as a result, the liquid crystal layer 118 in FIG. 15 is to be formed. That is, the liquid crystal layer 118 is arranged such that at the intersections of the data lines 212 and the scanning lines 312, the scanning lines 312, the pixel electrodes 234, and the liquid crystals 105 that are placed therebetween.

On the opposite electrode 300, according to the usage of the liquid crystal panel 100, for example, color filters are arranged in strips, mosaic shape, and triangular shape, and the like, and the black matrices are provided for light-shielding on the other areas. In addition, on each of the facing surfaces of the element substrate 200 and the opposite substrate 300, an oriented film is provided that is rubbing treated in a predetermined direction and the likes. On the other hand, on each of the back side thereof, a polarizer corresponding to an oriented direction is provided (neither of them are shown).

However, in the liquid crystal panel 100, if a liquid crystal of high polymer distributed type of which the liquid crystal is distributed as fine particles among the high polymers is used, then the above described oriented film and polarizer are not required, so that a light utilization efficiency is enhanced. As a result, it is advantageous in obtaining high intensity and low consumption electric power in the liquid crystal panel. Further, if the liquid crystal panel 100 is reflective type, then the pixel electrode 234 may be constituted of a metal film with a higher reflective index such as aluminum, and the liquid crystal of SH (Super-Homeotropic type) may be used in which the liquid crystal molecules are to be oriented approximately in vertical direction under the non-voltage applied condition.

The TFD 220 is one example of a non-linear element of two-terminal type, and a ZnO (Zinc Oxide) varistor, an element using the MSI (Metal Semi-Insulator) and the like, in which two of these elements are inversely connected in series or in parallel may be applicable.

As shown in FIG. 15, the X driver 250 is referred to as a data line driving circuit, in general, and the data signals X1 to X160 are provided to each of the data lines 212, respectively, in response to the displayed contents. Further, the voltage of this data signal is defined with either V1 or GND. On the other hand, the scanning line driving circuit as the receiving circuit 600 is constituted of a buffer 610 that inputs the logic signal, and a Y driver 650 which selects the voltages V4, V1, GND or V3 based on the logic signal from this buffer 610, and applies the voltages as the scanning signals Y1 to Y200 to the respective scanning lines 312. Further, the driving voltage forming circuit 300 is the one that produces the voltages V4, V1, GND or V3 to be used with the X driver 250 and the Y driver 650.

Incidentally, the X driver 250 is installed at the periphery of the element substrate 200 according to the COG technique. The buffer 610 and the Y driver 650 as the receiving circuit 600 are integrated and installed at the periphery of the opposite substrate 300. Further, the transmitting circuit 400 as the external control circuit supplies the data in response to the content to be displayed for the X driver 250. On the other hand, the Y driver 650 supplies a clock signal and a control signal and the like for applying the scanning signal to each of the scanning lines 312. The logic signals such as the clock signal and the control signal that are supplied to the Y driver 650 are arranged to be output through the capacitor 500 after the amplitudes thereof have been expanded by the buffer 430, respectively. Further, in practice, the buffers 430 and 610 and the capacitor 500 are provided for every one line of the logic signals.

Figure 17:
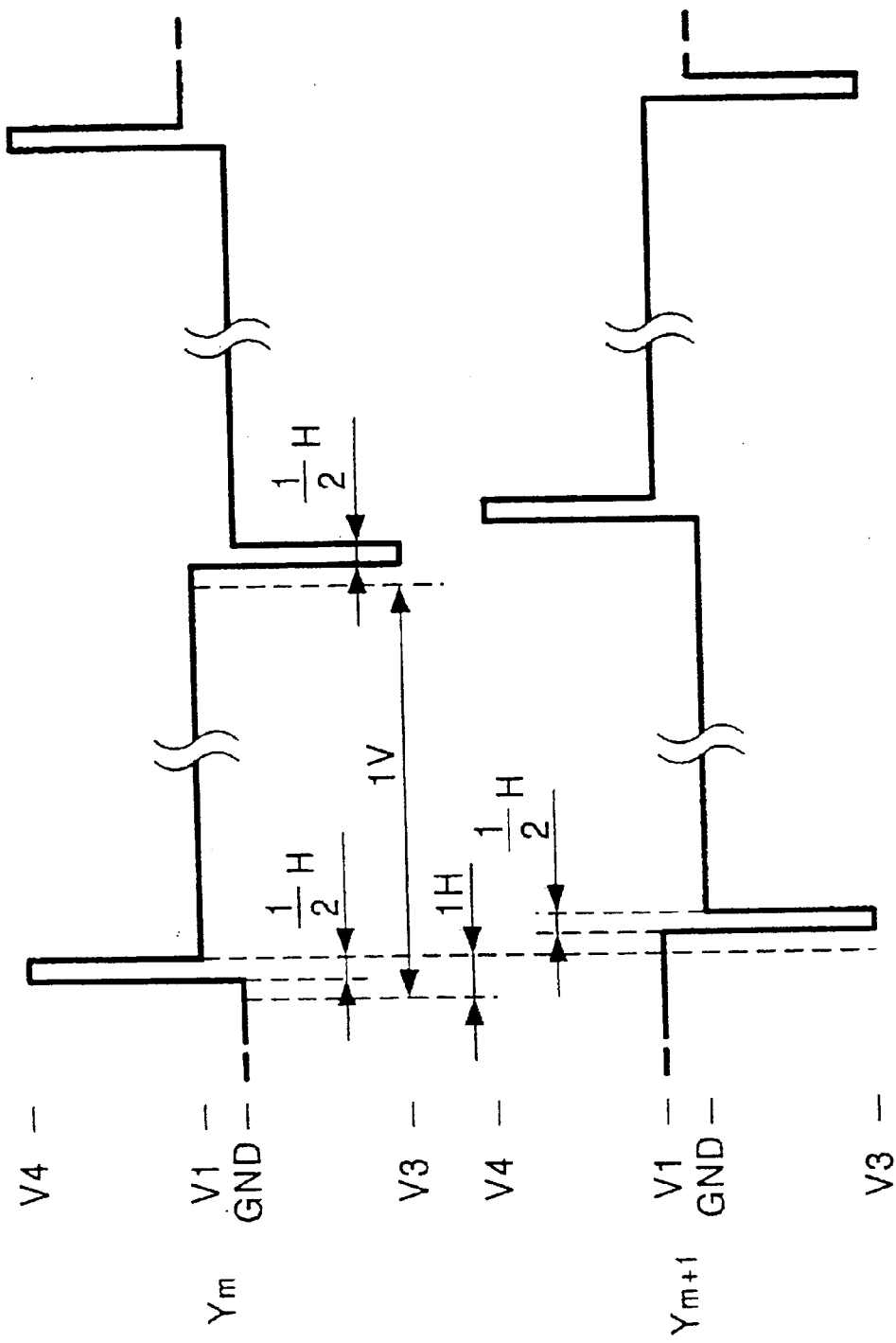
FIG. 17 is a diagram showing the waveforms of the scanning signals in the liquid crystal device of FIG. 15.
Figure 18:
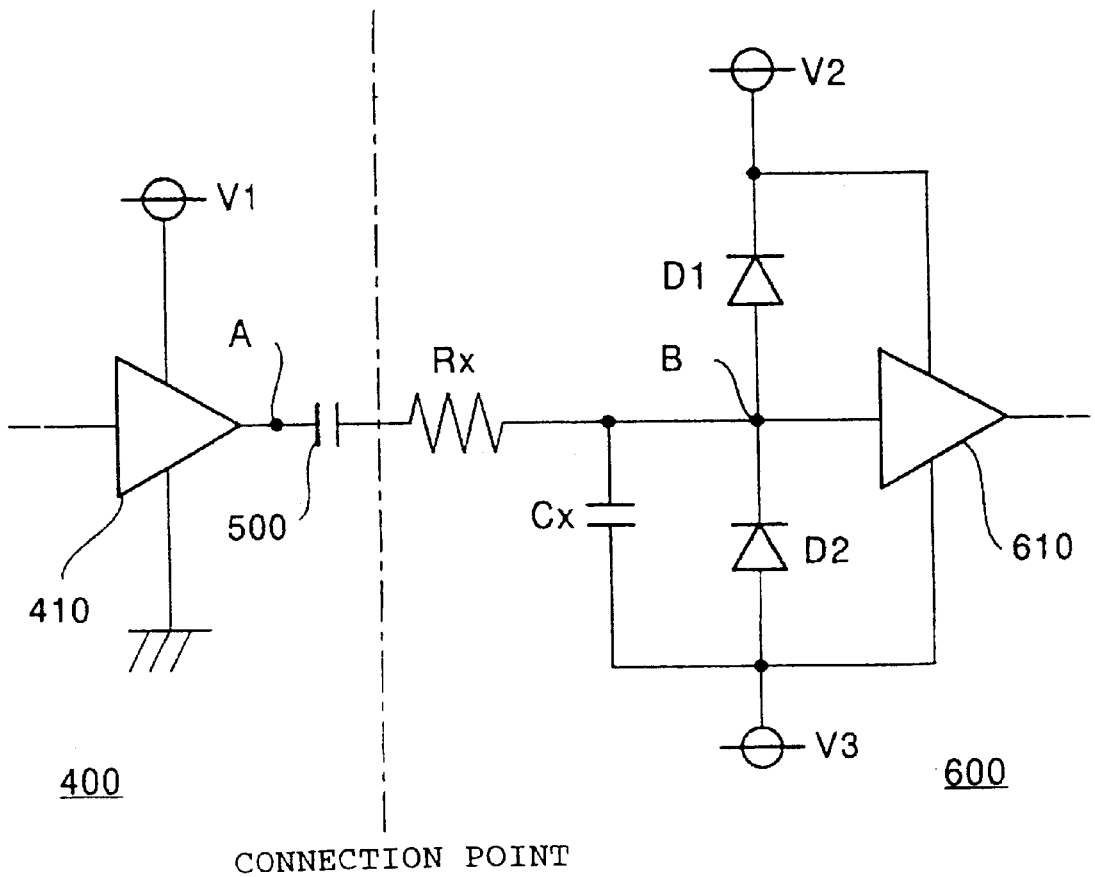
FIG. 18 is a block diagram showing a related arrangement.
Figure 19:
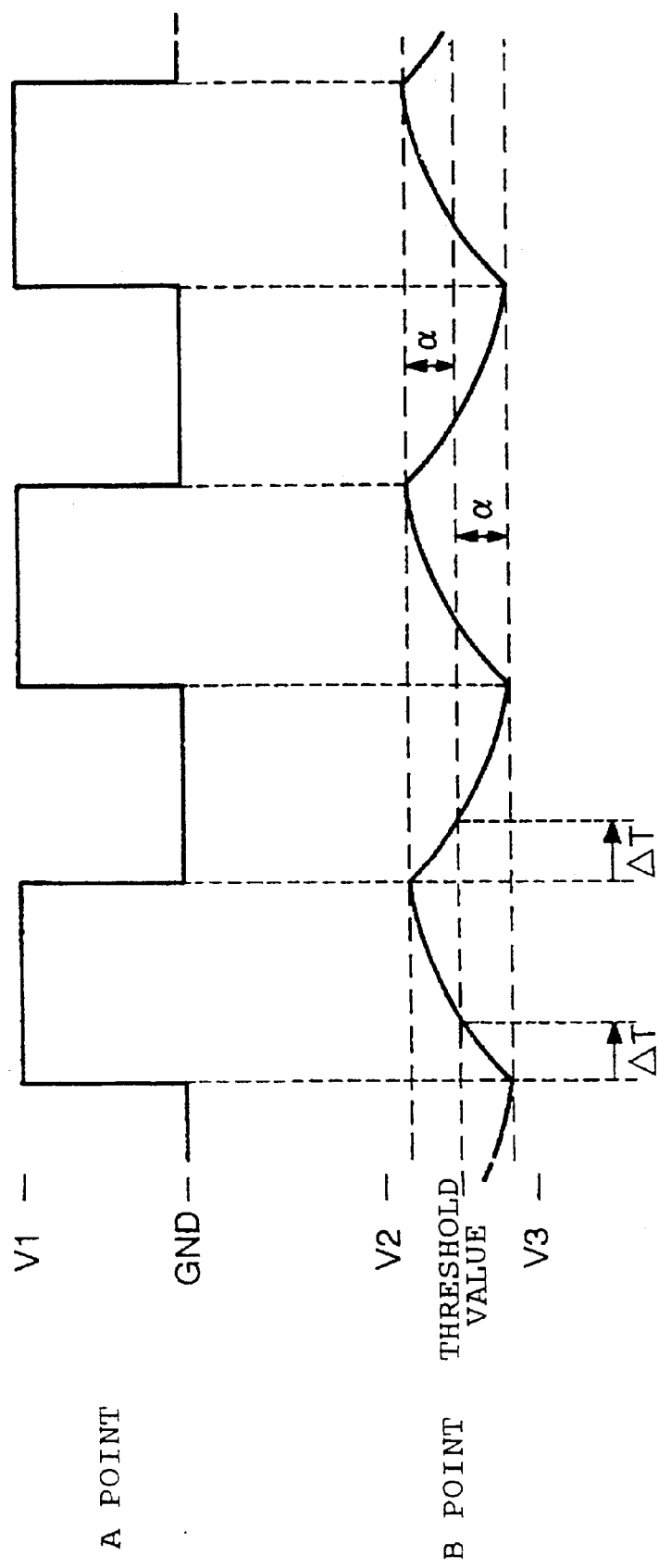
FIG. 19 is a voltage waveform diagram for illustrating the problems in the arrangement of FIG. 18.

The waveforms of the scanning signals are as shown in FIG. 17, for example. The waveforms shown in FIG. 17 represent the scanning signals that are supplied to a certain scanning line Ym (Y1≦Ym<Y200), and the scanning line Ym+1 that is located in the following position of the scanning line Ym, respectively. In these figures, V4 represents a selection voltage on a positive electrode side, and V3 represents a selection voltage on a negative electrode side. Further, V1 represents a non-selection voltage on the positive electrode side, and GND represents a non-selection voltage on the negative electrode side. Moreover, the polarity being referred herein is defined as basis of the mid-value of the voltages that are applied to the data lines 212, i.e., (V1–GND)/2.

Herein, one scanning line 312 is selected, and the selected voltage V4 is applied as a scanning signal in the last half (½ H) during one horizontal scanning period of time, then the corresponding TFD 220 reaches a conduction state. If, at the time of this conduction state, in applying the data signal through the data line 212, a predetermined charge is accumulated in the liquid crystal layer 118 that is connected to the TFD 220. After the accumulation of the charge, a non-selected voltage V1 is applied, so that even when the TFD 220 reaches in a non-conduction state, a leak (off-leak) of the TFD 220 is little, and if a resistance of the liquid crystal layer 118 is sufficiently large, then the accumulation of the charge in the liquid crystal layer 118 is maintained. Then, after one vertical scanning period of time (1V) has passed again, the same scanning 312 is selected, and if the selected voltage V1 is applied as a scanning signal in the last half (½ H) during the one horizontal scanning period of time thereof, then similarly, the corresponding TFD 220 reaches a conduction state. If, at the time of this conduction state, similarly, in applying the data signal through the data line 212, a predetermined charge is accumulated in the liquid crystal layer 118 that is connected to the TFD 220. After the accumulation of the charge, a non-selected voltage GND is applied, so that even when the TFD 220 reaches a non-conduction state, the accumulation of the charge in the liquid crystal layer 118 is maintained. As described above, by controlling the amount of the charge to be accumulated by AC (alternating-current) driving the respective TFD 220, the oriented state of the liquid crystal changes for each pixel, so that it is possible to display a predetermined information.

Incidentally, by applying the Y driver 650 as the post stage circuit of the buffer 610, the operation voltage range of this Y driver 650 changes from V4 to V3. However, the scanning line to be selected during certain selection period of time is usually just one line, so that the voltages V3 and V4 are never output simultaneously. As a result, by employing an arrangement such that the power supply voltage of the Y driver 650 is set as "V4–GND" during the selected period of time for outputting the voltage V1 on the positive electrode side, but on the other hand, during the selected period of time for outputting the voltage V3 on the negative electrode side, it is set as "V1–V3", and the withstanding pressure of this Y driver 650 can be maintained with approximately one-half of "V4–V3".

Further, in this exemplary embodiment, the liquid crystal panel 100 has been described by taking the TFD 220 as an example, but it is not limited thereto. Accordingly, the scanning lines and the data lines may be provided on one of the substrates, using the TFT (Thin Film Transistor) at the respective intersections thereof, the gates being connected to the scanning lines, the sources being connected to the data lines, and the drains being connected to the pixel electrodes, respectively. In addition, it is also applicable to the liquid crystal of passive type and the like that uses the liquid crystal of an STN (Super Twisted Nematic) type without using these switching elements. Further, it is also applicable to the electro-optical apparatus that performs a display using the various kinds of electro-optical effects, such as the electroluminescence display apparatus, in which the luminous layer is arranged instead of the liquid crystal.

As described above, according to the present invention, even if the amounts of the wiring resistance and the stray capacitance are increased, the signal delay on the receiving circuit side may be suppressed, and it may be possible to prevent a malfunction by securing the noise margin.

What is claimed is:

1. A receiving circuit that receives a logic signal transmitted from a transmitting circuit through a capacitor, said receiving circuit comprising:

a logic element to which received logic signal is input, a power supply voltage to the logic element to which the received logic signal is input being made smaller than an amplitude voltage of a logic signal transmitted from said transmitting circuit;

a buffer that inputs the received logic signal; and a feedback circuit that feeds back an output signal of said buffer to an input of said buffer.

2. An electro-optical apparatus, comprising:

a pair of substrates with an electro-optical material therebetween;

a pixel provided corresponding to each intersection of scanning lines and data lines; and the receiving circuit according to claim 1 used as an input circuit in a scanning line driving circuit that drives said scanning lines, said scanning line driving circuit being installed on a substrate among said pair of substrates, on which said scanning lines are formed.

3. A receiving circuit that receives a logic signal transmitted from a transmitting circuit through a capacitor, said receiving circuit comprising:

a logic element to which received logic signal is input, a power supply voltage to the logic element to which the received logic signal is input being made smaller than an amplitude voltage of a logic signal transmitted from said transmitting circuit; and a buffer that buffers by adding a hysteresis characteristic to the received logic signal.

4. A transmitting-receiving circuit, comprising:

a transmitting circuit that transmits a logic signal;

a receiving circuit that receives the logic signal transmitted from said transmitting circuit through a capacitor, an amplitude voltage of the logic signal transmitted from said transmitting circuit being larger than a power supply voltage to a logic signal that receives said logic signal in said receiving circuit; and two sets of power supply voltages with approximately equal voltage differences being alternately supplied for a predetermined period of time as a power supply voltage to the logic element that receives the logic signal.

5. A transmitting buffer, in a controlling circuit, that transmits to a receiving buffer, in a driving circuit that drives an electro-optical element under the control of the controlling circuit, through a connection line therebetween having a wiring resistance and a stray capacitance, a logic signal relevant to the driving of the electro-optical element having an amplitude voltage that is larger than a power supply voltage of the receiving buffer and that is sufficiently large to reduce a delay time of the logic signal due to the wiring resistance and the stray capacitance of the connection line so that the delay time is shorter than the duration of the logic signal.

6. An electro-optical apparatus, comprising:
   a pair of substrates with an electro-optical material therebetween;
   a pixel provided corresponding to each intersection of scanning lines and data lines; and
   the transmitting circuit according to claim 5 used as an input circuit in a scanning line driving circuit that drives said scanning lines, said scanning line driving circuit being installed on a substrate among said pair of substrates, on which said scanning lines are formed.

7. A transmitting buffer that transmits to a receiving buffer, through a connection line therebetween having a wiring resistance and a stray capacitance, a logic signal having an amplitude voltage that is larger than a power supply voltage of the receiving buffer and that is sufficiently large to reduce a delay time of the logic signal due to the wiring resistance and the stray capacitance of the connection line so that the delay time is shorter than the duration of the logic signal.

8. A transmitting circuit comprising a transmitting buffer according to claim 7.

9. A transmitting circuit according to claim 8, further comprising a level shifter that expands the amplitude voltage of the logic signal.

10. A transmitting circuit according to claim 9, further comprising
    a holding element that holds a predetermined voltage, and wherein the level shifter is a logic element in which a voltage, to or from which the predetermined voltage held in the holding element is added or subtracted, is set to be a power supply voltage.

11. A transmitting circuit according to claim 8, further comprising a holding element that holds a predetermined voltage, the voltage held in the holding element being added to or subtracted from one of a plurality of levels of the logic signal.

12. An electro-optical apparatus, comprising:
    a pair of substrates with an electro-optical material therebetween;
    a pixel provided corresponding to each intersection of scanning lines and data lines; and
    the transmitting circuit according to claim 7 used as an input circuit in a scanning line driving circuit that drives said scanning lines, said scanning line driving circuit being installed on a substrate among said pair of substrates, on which said scanning lines are formed.

13. A receiving buffer, in a driving circuit that drives an electro-optical element, that receives a logic signal relevant to the driving of the electro-optical element through a connection line therebetween having a wiring resistance and a stray capacitance, from a transmitting buffer in a controlling circuit that controls the driving of the driving circuit, wherein the logic signal has an amplitude voltage that is larger than a power supply voltage of the receiving buffer and that is sufficiently large to reduce a delay time of the logic signal due to the wiring resistance and the stray capacitance of the connection line so that the delay time is shorter than the duration of the logic signal.

14. An electro-optical apparatus, comprising:
    a pair of substrates with an electro-optical material therebetween;
    a pixel provided corresponding to each intersection of scanning lines and data lines; and
    the receiving buffer according to claim 13 used as an input circuit in a scanning line driving circuit that drives said scanning lines, said scarring line driving circuit being installed on a substrate among said pair of substrates, on which said scanning lines are formed.

15. A receiving buffer that receives from a transmitting buffer, through a connection line therebetween having a wiring resistance and a stray capacitance, a logic signal having an amplitude voltage that is larger than a power supply voltage of the receiving buffer and that is sufficiently large to reduce a delay time of the logic signal due to wiring resistance and the stray capacitance of the connection line so that the delay time is shorter than the duration of the logic signal.

16. A receiving circuit comprising:
    a receiving buffer according to claim 15; and
    a feedback circuit that feeds back an output logic signal of the receiving buffer to an input logic signal thereof.

17. A receiving circuit comprising:
    a receiving buffer according to claim 15, the receiving buffer adding a hysteresis characteristic to the received logic signal.

18. An electro-optical apparatus, comprising:
    a pair of substrates with an electro-optical material therebetween;
    a pixel provided corresponding to each intersection of scanning lines and data lines; and
    the receiving buffer according to claim 15 used as an input circuit in a scanning line driving circuit that drives said scanning lines, said scanning line driving circuit being installed on a substrate among said pair of substrates, on which said scanning lines are formed.

* * * * *